(12) United States Patent
Lee

(10) Patent No.: US 10,069,102 B2
(45) Date of Patent: Sep. 4, 2018

(54) ORGANIC ELECTROLUMINESCENCE DISPLAY DEVICE

(71) Applicant: Samsung Display Co., Ltd., Yongin-si, Gyeonggi-do (KR)

(72) Inventor: Hyunshik Lee, Incheon (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/612,141

(22) Filed: Jun. 2, 2017

(65) Prior Publication Data

US 2018/0040847 A1 Feb. 8, 2018

(30) Foreign Application Priority Data

Aug. 5, 2016 (KR) .......................... 10-2016-0099999

(51) Int. Cl.
*H01L 51/52* (2006.01)
*H01L 27/32* (2006.01)

(52) U.S. Cl.
CPC ...... *H01L 51/5237* (2013.01); *H01L 51/5256* (2013.01); *H01L 27/3206* (2013.01); *H01L 27/3227* (2013.01); *H01L 51/5253* (2013.01)

(58) Field of Classification Search
None
See application file for complete search history.

(56) References Cited

U.S. PATENT DOCUMENTS

| 6,734,625 B2 | 5/2004 | Vong et al. | |
| 2011/0121271 A1* | 5/2011 | Jeon | H01L 51/5253 257/40 |
| 2012/0256218 A1* | 10/2012 | Kwack | H01L 51/5256 257/98 |
| 2015/0137109 A1* | 5/2015 | Park | H01L 51/5268 257/40 |

FOREIGN PATENT DOCUMENTS

| KR | 10-2004-0085675 A | 10/2004 |
| KR | 10-2013-0036843 A | 4/2013 |
| KR | 10-2014-0120543 A | 10/2014 |

* cited by examiner

*Primary Examiner* — Ashok Patel
(74) *Attorney, Agent, or Firm* — Innovation Counsel LLP

(57) ABSTRACT

Provided is an organic electroluminescence display device including a base member, a display member disposed on the base member and including an organic electroluminescent element; and an encapsulating member disposed on the display member and encapsulating the display member. The encapsulating member includes a first inorganic layer disposed on the display member; a first organic layer disposed on the first inorganic layer; and a second inorganic layer disposed on the first organic layer. The first inorganic layer has a multilayer structure in which first layers having a first refractive index and second layers having a second refractive index different from the first refractive index are alternately disposed. Each of the first organic layer and the second inorganic layer has a single layer structure.

18 Claims, 11 Drawing Sheets

ORGANIC ELECTROLUMINESCENCE DISPLAY DEVICE

CROSS-REFERENCE TO RELATED APPLICATION

This U.S. non-provisional patent application claims priority under 35 U.S.C. § 119 of Korean Patent Application No. 10-2016-0099999, filed on Aug. 5, 2016, the entire content of which is hereby incorporated by reference.

BACKGROUND

1. Field

The present disclosure herein relates to an organic electroluminescence display device, and particularly to an organic electroluminescence display device having high efficiency and long service life.

2. Description of the Related Art

Flat display devices may be roughly classified into a light-emitting type and a light-receiving type. The light-emitting type includes flat cathode ray tubes, plasma display panels, organic electroluminescence display devices (OLED), and the like. The organic electroluminescence display device is a self light-emitting display device and has merits of a wide viewing angle, a superior contrast, and a fast response speed.

Accordingly, since the organic electroluminescence display device may be used for display devices for mobile devices such as digital cameras, video cameras, camcorders, portable information terminals, smart phones, ultra-slim notebook computers, tablet personal computers, or flexible display devices, or large-size electronic products or the large-size electric products such as ultra-slim televisions, the organic electroluminescence display device has been highlighted.

The organic electroluminescence display device realizes colors using a principle in which holes and electrons which are respectively injected from first and second electrodes are recombined to emit light and emit light when excitons in which the injected holes and electrons are combined are dropped from an excited state to a ground state.

SUMMARY

The present disclosure provides an organic electroluminescence display device having a superior light efficiency.

The present disclosure provides an organic electroluminescence display device having a long service life.

An embodiment of the present disclosure provides an organic electroluminescence display device including: a base member; a display member disposed on the base member and including an organic electroluminescent element; and an encapsulating member disposed on the display member and encapsulating the display member, wherein the encapsulating member includes: a first inorganic layer disposed on the display member; a first organic layer disposed on the first inorganic layer; and a second inorganic layer disposed on the first organic layer, wherein the first inorganic layer has a multilayer structure in which first layers having a first refractive index and second layers having a second refractive index different from the first refractive index are alternately disposed, and each of the first organic layer and the second inorganic layer has a single layer structure.

The first inorganic layer may include: a first sub inorganic layer disposed on the display member; a second sub inorganic layer disposed on the first sub inorganic layer; and a third sub inorganic layer disposed on the second sub inorganic layer, wherein each of the first sub inorganic layer, the second sub inorganic layer, and the third sub inorganic layer may include one of the first layers and one of the second layers.

The first and second layers may contact each other.

A thickness of the first sub inorganic layer may be greater than a thickness of the second sub inorganic layer and smaller than a thickness of the third sub inorganic layer.

A thickness of the first sub inorganic layer may be about 270 nm to about 300 nm inclusive, a thickness of the second sub inorganic layer may be about 210 nm to about 250 nm inclusive, and a thickness of the third sub inorganic layer may be greater than about 300 nm and equal to or smaller than 360 nm.

The first inorganic layer may have three reflectivity peaks in a wavelength range of about 380 nm to about 780 nm inclusive.

The three reflectivity peaks may include: a first reflectivity peak in a wavelength range of about 380 nm to about 450 nm inclusive; a second reflectivity peak in a wavelength range of about 480 nm to about 580 nm inclusive; and a third reflectivity peak in a wavelength range of about 590 nm to about 700 nm inclusive.

The first refractive index may be about 1.65 to about 1.80 inclusive, and the second refractive index may be about 1.40 to about 1.50 inclusive.

The first refractive index may be greater than the second refractive index, the first layer may include at least one of silicon nitride or silicon oxynitride, and the second layer may include silicon oxide.

A thickness of the first organic layer may be about three times to about eight times greater than a thickness of the first inorganic layer.

The encapsulating member may further include: a second organic layer disposed on the second inorganic layer; and a third inorganic layer disposed on the second organic layer, wherein each of the second organic layer and third inorganic layer may have a single layer structure.

The organic electroluminescent element may include: a first electrode disposed on the base member; an organic layer including a light emitting layer disposed on the first electrode; a second electrode dispose on the organic layer; and a capping layer disposed on the second electrode.

The organic electroluminescence display device may further include a protective layer disposed between the capping layer and the encapsulating member.

A thickness of the first inorganic layer may be greater than a thickness of the capping layer.

In an embodiment of the present disclosure, an organic electroluminescence display device includes: a base member; a display member disposed on the base member and including an organic electroluminescent element; and an encapsulating member disposed on the display member and encapsulating the display member, wherein the encapsulating member includes at least one organic layer and at least one inorganic layer which are alternately disposed therein, wherein an inorganic layer disposed most adjacent to the display member from among the at least one inorganic layer has: a multilayer structure in which a first layer having a first refractive index and a second layer having a second refractive index different from the first refractive index are alternately disposed, and each of the remaining inorganic layers among the at least one inorganic layer except for the inorganic layer disposed most adjacent to the display member and the at least one organic layer has a single layer structure.

The inorganic layer disposed most adjacent to the display member may include: a first sub inorganic layer disposed on the display member; a second sub inorganic layer disposed on the first sub inorganic layer; and a third sub inorganic layer disposed on the second sub inorganic layer, wherein each of the first sub inorganic layer, the second sub inorganic layer, and the third sub inorganic layer may include one of the first layers and one of the second layers.

A thickness of the first sub inorganic layer may be greater than a thickness of the second sub inorganic layer and smaller than a thickness of the third sub inorganic layer.

A thickness of the first sub inorganic layer may be about 270 nm to about 300 nm inclusive, a thickness of the second sub inorganic layer may be about 210 nm to about 250 nm inclusive, and a thickness of the third sub inorganic layer may be greater than about 300 nm and equal to or smaller than 360 nm.

The first refractive index may be about 1.65 to about 1.80 inclusive, and the second refractive index may be about 1.40 to about 1.50 inclusive.

The first refractive index may be greater than the second refractive index, the first layer may include at least one of silicon nitride or silicon oxynitride, and the second layer may include silicon oxide.

BRIEF DESCRIPTION OF THE FIGURES

The accompanying drawings are included to provide a further understanding of the present disclosure, and are incorporated in and constitute a part of this specification. The drawings illustrate exemplary embodiments of the present disclosure and, together with the description, serve to explain principles of the present disclosure. In the drawings.

DETAILED DESCRIPTION

Figure 1:
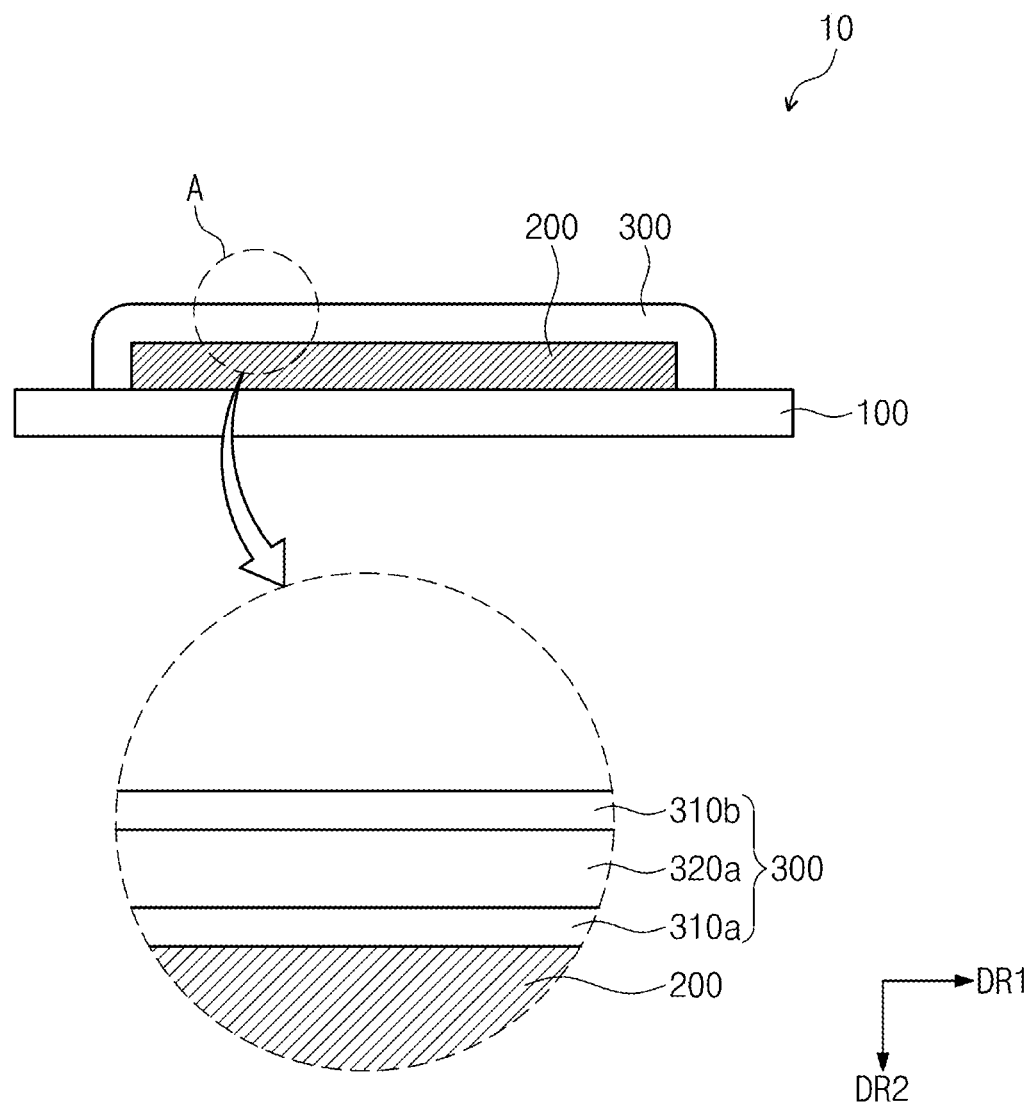
FIG. 1 is a schematic cross-sectional view of an organic electroluminescence display device according to an embodiment of the present disclosure.

The features of the present disclosure will be understood without difficulties through the embodiments below related to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

In describing the drawings, like reference numerals refer to like elements throughout. In the drawings, the dimension and size of each structure are exaggerated, omitted, or schematically illustrated for convenience in description and clarity. It will be understood that although the terms of first and second are used herein to describe various elements, these elements should not be limited by these terms. Terms are only used to distinguish one component from other components. For example, an element referred to as a first element in one embodiment can be referred to as a second element in another embodiment. The terms of a singular form may include plural forms unless referred to the contrary.

In the specification, the meaning of 'include' or 'comprise' specifies a property, a numeral, a step, an operation, an element or a combination thereof, but does not exclude other properties, numerals, steps, operations, elements or combinations thereof. In addition, it will be understood that when a layer, a film, a region, or a plate is referred to as being 'on' another layer, region, film, or plate, it can be directly on the other layer, film, region, or plate, or intervening layers, films, regions, or plates may also be present. On the contrary, it will be understood that when a layer, a film, a region, or a plate is referred to as being 'under' another layer, region, or plate, it can be directly under the other layer, film, region, or plate, or intervening layers, films, regions, or plates may also be present.

FIG. 1 is a schematic cross-sectional view of an organic electroluminescence display device 10 according to an embodiment of the present disclosure.

Referring to FIG. 1, the organic electroluminescence display device 10 according to an embodiment of the present disclosure includes a base member 100, a display member 200, and an encapsulating member 300.

The display member 200 including organic electroluminescence elements is disposed on the base member 100. The base member 100 may be formed of a material, which is not specially limited as long as being commonly used, such as glass, plastic, quartz, or the like. The base member 100 may include organic polymers. Organic polymers included in the base member 100 may be polyethylene terephthalate (PET), polyethylene naphthalate (PEN), polyimide, polyether sulfone, etc. The base member 100 may include a flexible substrate. The base member 100 may be selected in consideration of mechanical strength, thermal stability, transparency, surface smoothness, ease of handling, waterproofing property, and the like.

The display member 200 includes organic electroluminescent elements as described herein. The display member 200 will be described in detail later.

The encapsulating member 300 is disposed on the display member 200 to cover the display member 200. The encapsulating member 300 encapsulates the display member 200 together with the base member 100. The encapsulating member 300 encapsulates the display member 200 to thereby prevent the display member 200 from being degraded due to permeation of external water, oxygen, or the like.

Referring to region A of FIG. 1, the encapsulating member 300 has a multilayered structure. Specifically, the encapsulating layer 300 includes a first inorganic layer 310a, a first organic layer 320a, and a second inorganic layer 310b. The first inorganic layer 310a is disposed on the display member 200, the first organic layer 320a is disposed on the first inorganic layer 310a, and the second inorganic layer 310b is disposed on the first organic layer 320a. That is, the first organic layer 320a is disposed between the first and second inorganic layers 310a and 310b.

Figure 2:
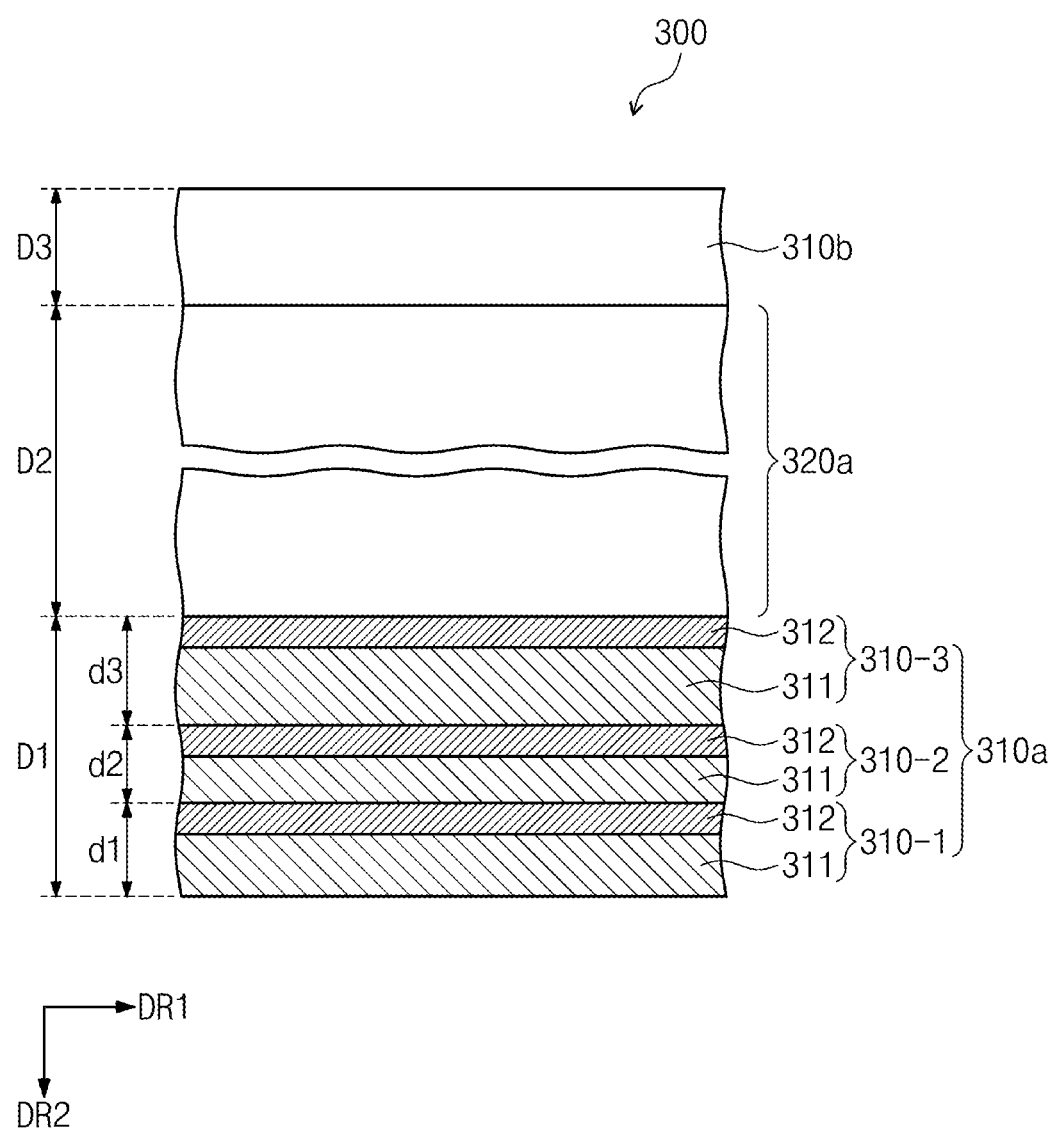
FIG. 2 is a schematic cross-sectional view of an encapsulating member included in an organic electroluminescence display device according to an embodiment of the present disclosure.
Figure 3:
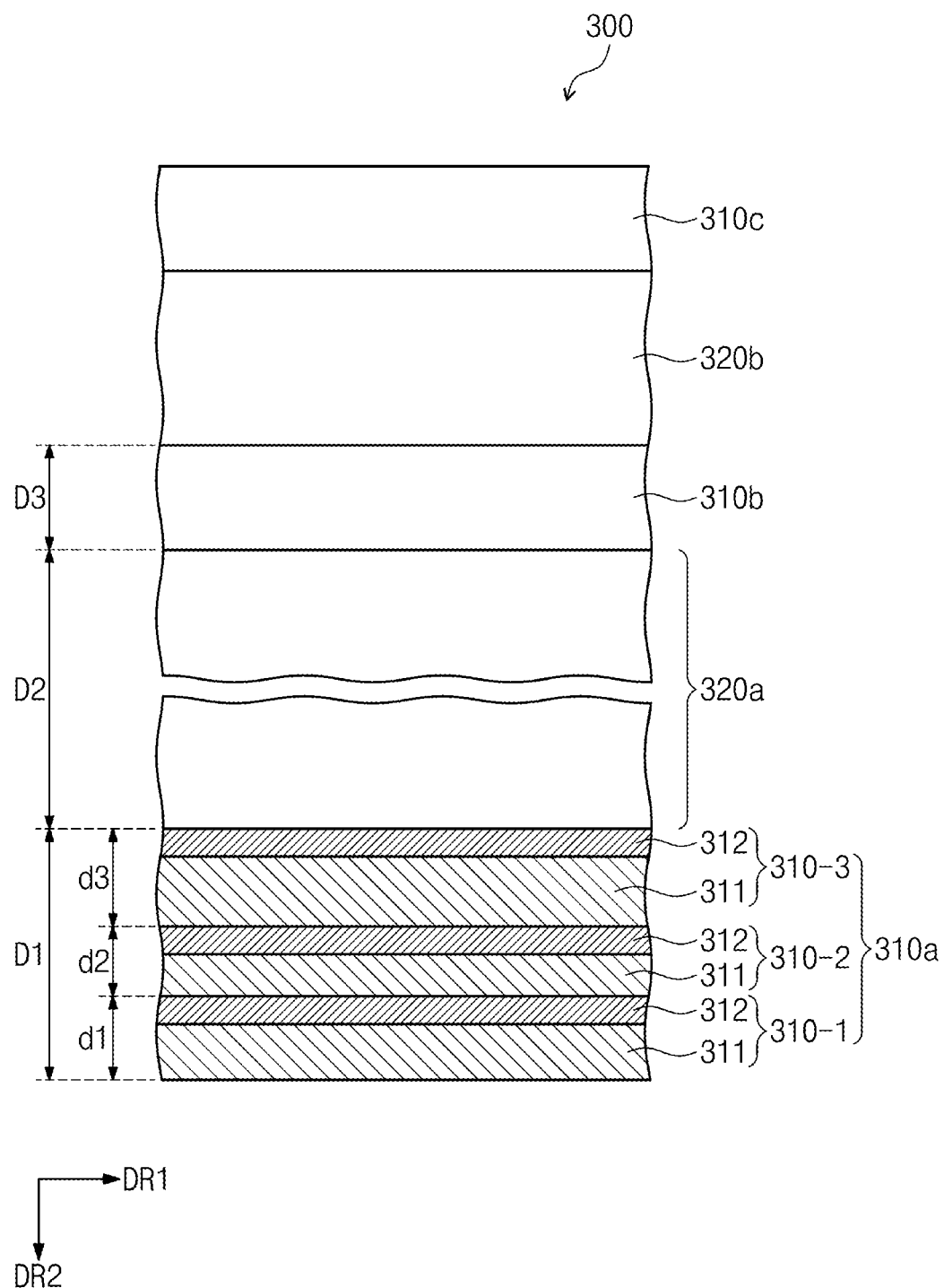
FIG. 3 is a schematic cross-sectional view of an encapsulating member included in an organic electroluminescence display device according to an embodiment of the present disclosure.

FIG. 2 is an enlarged cross-sectional view of the region A of the encapsulating member 300 of FIG. 1. FIG. 3 is an enlarged cross-sectional view of the region A of the encapsulating member 300 of FIG. 1 in accordance with another embodiment. Referring to FIGS. 1 to 3, the encapsulating member 300 will be described in more detail.

The first inorganic layer 310a has a multilayered structure, and each of the first organic layer 320a and the second inorganic layer 310b has a single-layered structure.

The first inorganic layer 310a has a multilayered structure in which a first layer 311 and a second layer 312, which have refractive indexes different from each other, are alternately disposed with each other. The first inorganic layer 310a has a multilayered structure in which a high-refraction layer and a low refraction layer are alternately disposed with each other. The first layer 311 has a first refractive index, and the second layer 312 has a second refractive index which is different from the first refractive index.

The first refractive index may be greater than the second refractive index. For example, the first refractive index may be about 1.65 to about 1.80 inclusive, and the second refractive index may be about 1.40 to about 1.50 inclusive. For example, the first refractive index may be about 1.73 and the second refractive index may be about 1.45. However, the embodiment of the present disclosure is not limited thereto.

The first layer 311 having a first refractive index may include at least one of silicon nitride, silicon oxynitride, titanium oxide, or aluminum oxide. The second layer 312 having the second refractive index may employ a material known in the art without a limit as long as the material only satisfies the condition of having a refractive index smaller than the refractive index of the first layer 311.

The first layer 311 having the first refractive index may include at least one of silicon nitride or silicon oxynitride, and the second layer 312 having the second refractive index may include silicon oxide. The first inorganic layer 310a may be formed through, for example, a chemical vapor deposition (CVD) method and may be deposited by using the same precursor when both the first layer 311 having the first refractive index and the second layer 312 having the second refractive index include a material including silicon, and thus has an effect of having an excellent process economy at the stage of forming the first inorganic layer 310a.

The first inorganic layer 310a may include a first sub inorganic layer 310-1, a second sub inorganic layer 310-2, and a third inorganic layer 310-3. The first sub inorganic layer 310-1 is disposed on the display member 200, the second sub inorganic layer 310-2 is disposed on the first sub inorganic layer 310-1, and the third sub inorganic layer 310-3 is disposed on the second sub inorganic layer 310-2.

The first sub inorganic layer 310-1 and the second sub inorganic layer 310-2 may be brought into contact with each other and the second sub inorganic layer 310-2 and the third sub inorganic layer 310-3 may be brought into contact with each other.

Each of the first sub inorganic layer 310-1, the second sub inorganic layer 310-2, and the third sub inorganic layer 310-3 may include one first layer 311 and one second layer 312. Here, the first and second layers 311 and 312 may be brought into contact with each other. That is, another layer such as a protective layer, a buffer layer may not be disposed between the first and second layers 311 and 312.

As described above, when the first inorganic layer 310a includes three sub inorganic layers 310-1, 310-2, and 310-3 which respectively include the one first and one second layers 311 and 312, there is an effect in that a light extracting efficiency of each of red, green, and blue light which are emitted from the display member 200 may be simultaneously improved.

The thickness d1 of the first sub inorganic layer 310-1 may be greater than the thickness d2 of the second sub inorganic layer 310-2 and smaller than the thickness d3 of the third sub inorganic layer 310-3. That is, the first sub inorganic layer 310-1 is thicker than the second sub inorganic layer 310-2, and thinner than the third sub inorganic layer 310-3.

In the specification, "thickness" may mean an average value of the thicknesses which the corresponding component may have.

However, the embodiment of the present disclosure is not limited thereto, the thickness d1 of the first sub inorganic layer 310-1 may be about 270 nm to about 300 nm inclusive, and the thickness d2 of the second sub inorganic layer 310-2 may be about 210 nm to about 250 nm inclusive, and thickness d3 of the third sub inorganic layer 310-3 may be greater than about 300 nm and equal to or smaller than about 360 nm. When the thicknesses of the first sub inorganic layer 310-1, the second sub inorganic layer 310-2, and the third sub inorganic layer 310-3 satisfy the above ranges, an extracting efficiency of the light emitted from the organic electroluminescent element may be maximized. More specifically, when all the thicknesses of the first sub inorganic layer 310-1, the second sub inorganic layer 310-2, and the third sub inorganic layer 310-3 satisfy the above ranges, a light extracting efficiency of all the red, green, and blue light which are emitted from organic electroluminescent element may be improved, and consequently, a light extracting efficiency of the organic electroluminescent display device may be maximized.

For example, the thickness d1 of the first sub inorganic layer 310-1 may be about 300 nm, the thickness d2 of the second sub inorganic layer 310-2 may be about 230 nm, and the thickness d3 of the third sub inorganic layer 310-3 may be about 330 nm.

The first inorganic layer 310a may have a plurality of peaks in reflectivity in the visible light region. Specifically, the first inorganic layer 310a may have three peaks in reflectivity in the visible light region. The first inorganic layer 310a may have three peaks in reflectivity in the wavelength region of about 380 nm to about 780 nm inclusive. The first inorganic layer 310a may have three peaks in reflectivity which are 20% or more in the wavelength region of about 380 nm to about 780 nm inclusive.

The first inorganic layer 310a may respectively have one peak in reflectivity in the respective wavelength region of red, green, and blue light. In other words, the three reflectivity peaks include a first reflectivity peak in the wavelength region of red light, a second reflectivity peak in the wavelength region of green light, and a third reflectivity peak in the wavelength region of blue light. For example, the three reflectivity peaks may include the first reflectivity peak (e.g., RP1 of FIG. 9) in the wavelength region of about 380 nm to about 450 nm inclusive, the second reflectivity peak (e.g., RP2 of FIG. 9) in the wavelength region of 480 nm to about 580 nm inclusive, and the third reflectivity peak (e.g., RP3 of FIG. 9) in the wavelength region of about 590 nm to about 700 nm inclusive.

The first inorganic layer 310a has a multilayered structure in which first and second layers 311 and 312 which have different refractive indexes are alternately disposed, and therefore, has a high reflectivity characteristic so as to respectively have reflectivity peaks in the wave length regions of red, green, and blue light. Consequently, the extracting efficiency of the light emitted from the display member 200, and thereby total light efficiency of the organic electroluminescence display device 10 is improved.

The first organic layer 320a is disposed on the first inorganic layer 310a. The first organic layer 320a has a single layer structure as described above. The first organic layer 320a may employ common materials known as materials for an organic layer of the encapsulating member without a limit. For example, the first organic layer 320a may include polyacrylate, polyurea, or the like.

The first organic layer 320a may be formed on the first inorganic layer 310a through a coating method by using a composition including organic materials. However, the embodiment of the present disclosure is not limited thereto. The first organic layer 320a may be formed through an ink jet printing method.

The thickness D2 of the first organic layer 320a may be greater than the thickness D1 of the first inorganic layer 310a. The thickness D1 of the first inorganic layer 310a may be the sum of the thickness d1 of the first sub inorganic layer 310-1, the thickness d2 of the second sub inorganic layer 310-2, and the thickness d3 of the third sub inorganic layer 310-3. The thickness D2 of the first organic layer 320a may be about three to about ten times or about three to about eight times greater than the thickness D1 of the first inorganic layer 310a. However, the embodiment of the present disclosure is not limited thereto, the thickness D2 of the first organic layer 320a may be about 3 μm to about 10 μm inclusive or 3 μm to about 8 μm inclusive, and the thickness D1 of the first inorganic layer 310a may be about 0.7 μm to about 1.5 μm inclusive. For example, the thickness D2 of the first organic layer 320a may be about 4 μm, and the thickness D1 of the first inorganic layer 310a may about 1 μm.

The second inorganic layer 310b is disposed on the first organic layer 320a. Unlike the first inorganic layer 310a, the second inorganic layer 310b has a single layer structure. The second inorganic layer 310b may be formed, for example, through a chemical vapor deposition (CVD) method.

The second inorganic layer 310b may include at least one of silicon nitride, silicon oxynitride, silicon oxide, titanium oxide, or aluminum oxide. The second inorganic layer 310b may favorably include at least one of the silicon nitride or silicon oxynitride in view of process economy. For example, the second inorganic layer 310b may be a silicon nitride layer. Although not shown, an inorganic buffer layer may be further disposed on the second inorganic layer 310b. The inorganic buffer layer (not shown) may be an aluminum oxide layer, but the embodiment of the present disclosure is not limited thereto. Other layers such as an organic layer, a protective layer, or the like may not be disposed between the second inorganic layer 310b and the inorganic buffer layer, or may be disposed if necessary.

The thickness D3 of the second inorganic layer 310b may be smaller than the thickness D2 of the first organic layer 320a. That is, the first organic layer 320a may be thicker than each of the first and second inorganic layers 310a and 310b.

Organic layers such as the first organic layer 320a (hereinafter, referred to as "organic layer") which are included in the encapsulating member 300 alleviates internal stress of inorganic layers such as the first inorganic layer 310a or the second inorganic layer 310b (hereinafter, referred to as "inorganic layer(s)") and compensate micro cracks generated in inorganic layers, and thus functions to improve the effect of preventing permeation of external water or oxygen.

An inorganic layer included in the encapsulating member 300 functions to prevent water or oxygen from permeating from the outside into the organic electroluminescent element of the display member 200. In order to efficiently prevent external water or oxygen by means of the encapsulating member 300, the outermost layer of the encapsulating member 300 may be an inorganic layer. The outermost layer of the encapsulating member 300 means the layer disposed farthest from the display member 200 among the plurality of layers of the encapsulating member 300.

Organic layers are disposed between inorganic layers in the encapsulating member 300, and thus a stable encapsulating member 300 which is provided with both flexibility and moisture permeation resistance may be realized. To impart flexibility to the encapsulating member 300, organic layers may be formed thicker than inorganic layers as described above.

FIG. 3 is a schematic cross-sectional view of the encapsulating member 300 included in an organic electroluminescence display device according to an embodiment of the present disclosure.

Referring to FIG. 3, the encapsulating member 300 may further include additional organic and inorganic layers. For example, the encapsulating member 300 may further include a second organic layer 320b disposed on the second inorganic layer 310b and a third inorganic layer 310c disposed on the second organic layer 320b. Each of the second organic layer 320b and the third inorganic layer 310c may have a single layer.

The second organic layer 320b may be thicker than each of the first inorganic layer 310a, the second inorganic layer 310b and the third inorganic layer 310c. The second organic layer 320b may include polyacrylate, polyurea, or the like.

The third inorganic layer 310c may include at least one of silicon nitride, silicon oxynitride, silicon oxide, titanium oxide, or aluminum oxide. The second inorganic layer 310b may include at least one of silicon nitride or silicon oxynitride in view of process economy. For example, the third inorganic layer 310c may be a silicon nitride layer.

Figure 4:
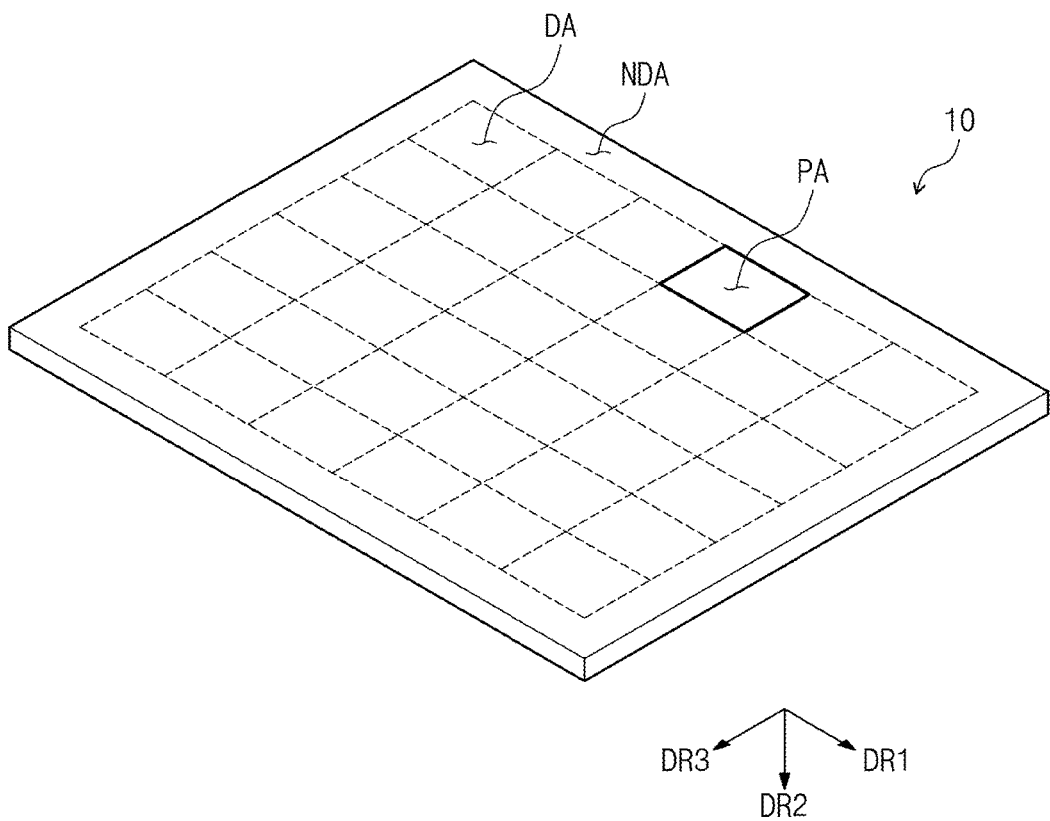
FIG. 4 is a perspective view of an organic electroluminescence display device according to an embodiment of the present disclosure.
Figure 5:
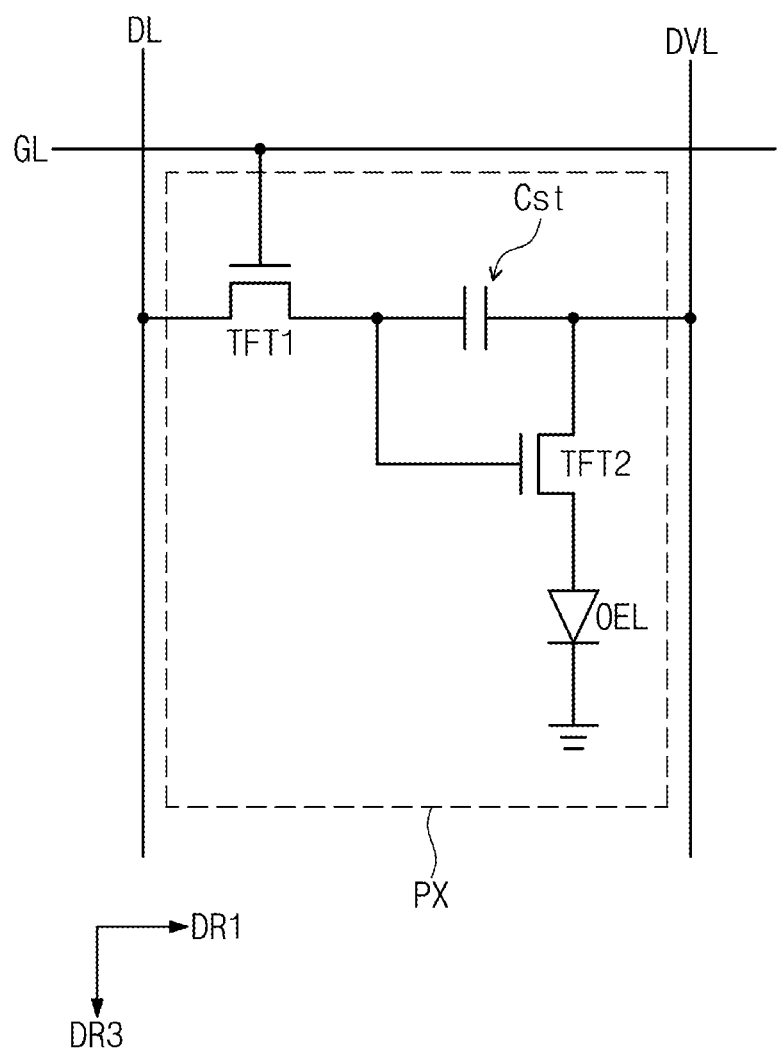
FIG. 5 is a circuit diagram of one pixel of pixels included in an organic electroluminescence display device according to an embodiment of the present disclosure.

FIG. 4 is a perspective view of an organic electroluminescence display device 10 according to an embodiment of the present disclosure. FIG. 5 is a circuit diagram of one pixel of pixels included in an organic electroluminescence display device according to an embodiment of the present disclosure.

Hereinafter, referring to FIGS. 4 and 5, the organic electroluminescence display device 10 according to an embodiment of the present disclosure will be described in more detail.

Referring to FIG. 4, the organic electroluminescence display device 10 according to an embodiment of the present disclosure is divided into a display region DA and a non-display region NDA. The display region DA displays an image. The electroluminescence display device 10 may have an approximately rectangular shape when viewed in the thickness direction (e.g., a second direction DR2) thereof, but the embodiment of the present disclosure is not limited thereto.

The display region DA may include a plurality of pixel regions PA. The pixel regions PA may be disposed in a matrix shape. A plurality of pixels PX may be disposed on the pixel regions PA. Each of the pixels PX includes an electroluminescent element (e.g., the electroluminescent element OEL of FIG. 7).

The non-display region NDA does not display an image. When viewed in the thickness direction DR2 of the electroluminescence display device 10, for example, the non-display region NDA may surround the display region DA. The non-display region NDA may be adjacent to the display region DA in a first direction DR1 and a third direction DR3. The third direction DR3 crosses each of the first and second directions DR1 and DR2.

Referring to FIG. 5, each of the pixels PX may be connected to a wiring part including a gate line GL, a data line DL, and a driving voltage line DVL. Each of the pixels PX includes thin film transistors TFT1 and TFT2 connected to the wiring part, an electroluminescent element OEL connected to the thin film transistors TFT1 and TFT2, and a capacitor Cst. The electroluminescent element OEL will be described in detail later.

The gate line GL extends in the first direction DR1. The data line DL extends in the third direction DR3 crossing the gate line GL. The driving voltage line DVL extends in a direction substantially the same as the data lines DL, that is, in the third direction DR3. The gate line GL transmits a scanning signal to the thin film transistors TFT1 and TFT2, the data line DL transmits a data signal to the thin film transistors TFT1 and TFT2, and the driving voltage line DVL provides a driving voltage to the thin film transistors TFT1 and TFT2.

The thin film transistors TFT1 and TFT2 may include a driving thin film transistor TFT2 for controlling the electroluminescent element OEL, and a switching thin film transistor TFT1 switching the driving thin film transistor TFT2. In an embodiment of the present disclosure, it is described that each of the pixels PX has two thin film transistors TFT1 and TFT2, but the present disclosure is not limited thereto, and each of the pixels PX may also include a thin film transistor and a capacitor, or each of the pixels PX may also include three or more thin film transistors and two or more capacitors.

Although not shown specifically, the thin film switching transistor TFT1 includes a first gate electrode, a first source electrode, and a first drain electrode. The first gate electrode is connected to the gate lines GL, and the first source electrode is connected to the data lines DL. The first drain electrode is connected to a first common electrode though a contact hole. The thin film switching transistor TFT1 transmits a data signal, applied to the data line DL according to a scanning signal applied to the gate line GL, to the driving thin film transistor TFT2.

Figure 6:
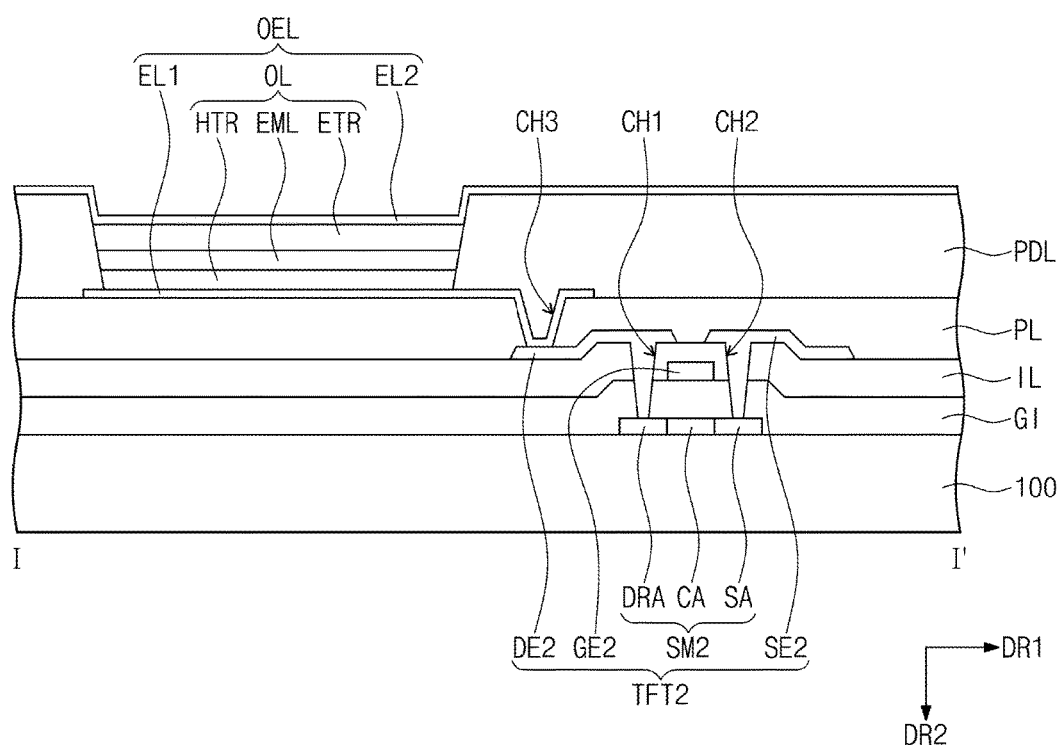
FIG. 6 is a schematic cross-sectional view of a portion of the circuit diagram according to FIG. 5.

FIG. 6 is a schematic cross-sectional view of a portion of the circuit diagram according to FIG. 5. Specifically, FIG. 6 is a schematic cross-sectional view of a portion corresponding to the driving thin film transistor TFT2 and the organic electroluminescent element OEL of FIG. 5.

Referring to FIGS. 5 and 6, the driving thin film transistor TFT2 includes a second gate electrode GE2, a second source electrode SE2, and a second drain electrode DE2. The second gate electrode GE2 is connected to a first common electrode CE1. The second source electrode SE2 is connected to a driving voltage line DVL. The second drain electrode DE2 is connected to a first electrode EL1 through a third contact hole CH3.

A capacitor Cst is connected between the second gate electrode GE2 and the second source electrode SE2 of the driving thin film transistor TFT2, and charges and maintains the data signal inputted to the second gate electrode GE2 of the driving thin film transistor TFT2.

A second semiconductor layer SM2 is disposed on the base member 100. Although not shown specifically, a first semiconductor layer (not shown) is also disposed on the base member 100, and the first semiconductor layer (not shown) is spaced apart from the second semiconductor layer SM2. The first semiconductor layer and the second semiconductor layer SM2 are formed of semiconductor materials, and respectively operate as an active layer of the switching thin film transistor TFT1 and the driving thin film transistor TFT2. The first semiconductor layer and the second semiconductor layer SM2 respectively include a source region SA and a drain region DRA, and a channel region CA provided between the source region SA and the drain region DRA. The first semiconductor layer and the second semiconductor layer SM2 may be respectively formed by being selected from an inorganic semiconductor or an organic semiconductor. The source region SA and the drain region DRA, sometimes called a source area SA and the drain area DRA, may be doped with n-type impurities or p-type impurities.

A gate insulating layer GI is provided on the first semiconductor layer (not shown) and the second semiconductor layer SM2. The gate insulating layer GI covers the first semiconductor layer (not shown) and the second semiconductor layers SM2. The gate insulation layer GI may be formed of organic or inorganic insulating materials.

Hereinafter, components included in the driving transistor TFT2 will be referred to as "a second ~".

The second gate electrode GE2 is disposed on the gate insulating layer GI. The second gate electrode GE2 is formed to cover the region corresponding to the channel region CA of the second semiconductor layer SM2.

An interlayer insulating layer IL is disposed on the second gate electrode GE2. The interlayer insulating layer IL covers the second gate electrode GE2. The interlayer insulating layer IL may be formed of organic or inorganic insulating materials.

The source electrode SE2 and the second drain electrode DE2 are disposed on the interlayer insulating layer IL. The second drain electrode DE2 contacts the drain area DRA of the second semiconductor layer SM2 through a first contact hole CH1 formed in the gate insulating layer GI and the interlayer insulating layer IL, and the second source electrode SE2 contacts the source area SA of the second semiconductor layer SM2 through a second contact hole CH2 formed in the gate insulating layer GI and the interlayer insulating layer IL.

A passivation layer PL is disposed on the second source electrode SE2 and the second drain electrode DE2. The passivation layer PL may function as a protective film which protects the switching thin film transistor TFT1 and the driving thin film transistor TFT2, and may also function as a planarizing film that planarizes upper surfaces of the switching thin film transistor TFT1 and the driving thin film transistor TFT2.

The organic electroluminescence element OEL is disposed on the passivation layer PL. The organic electroluminescence element OEL includes the first electrode EL1, a second electrode EL2 disposed on the first electrode EL1, and an organic layer OL disposed between the first and second electrodes EL1 and EL2 and including a light emitting layer EML.

Specifically, the first electrode EL1 is disposed on the passivation layer PL, and a pixel defining film PDL is disposed on the passivation layer PL and the first electrode EL1. The pixel defining film PDL exposes a portion of the upper surface of the first electrode EL1. The pixel defining layer PDL is not limited thereto but may include a metal-fluorine ion compound. For example, the pixel defining layer PDL may be formed of any one metal-fluorine ion compound selected from LiF, $BaF_2$, and CsF. The metal-fluorine ion compound has an insulating property when having a predetermined thickness.

The organic layer OL and the second electrode EL2 are sequentially laminated on the pixel defining layer PDL and the first electrode EL1.

The first electrode EL1 may be, for example, a positive electrode. The first electrode EL1 is connected to the second drain electrode DE2 of the driving thin film transistor TFT2 through the third contact hole CH3 formed in the passivation layer PL.

The first electrode EL1 has conductivity. The first electrode EL1 may be a pixel electrode or a positive electrode. The first electrode EL1 may be a transmissive electrode, a semi-transmissive electrode, or a reflective electrode. When the first electrode EL1 is a transmissive electrode, the first electrode EL1 may include transparent metal oxide, such as indium tin oxide (ITO), indium zinc oxide (IZO), zinc oxide (ZnO), or indium tin zinc oxide (ITZO). When the first electrode EL1 is a semi-transmissive or reflective electrode, the first electrode EL1 may include Ag, Mg, Al, Pt, Pd, Au, Ni, Nd, Ir, Cr or a mixture of metal.

The second electrode EL2 may be a common electrode or a negative electrode. The second electrode EL2 may be a transmissive electrode, semi-transmissive electrode, or a reflective electrode.

When the second electrode EL2 is a transmissive electrode, the second electrode EL2 may include Li, Ca, LiF/Ca, LiF/Al, Al, Mg, BaF, Ba, Ag, a compound thereof, or a mixture thereof (e.g., a mixture of Ag and Mg). However, the embodiment of the present disclosure is not limited thereto. For example, indium tin oxide (ITO), indium zinc oxide (IZO), zinc oxide (ZnO), or indium tin zinc oxide (ITZO) may also be included.

Although not shown, the second electrode EL2 may be connected to an auxiliary electrode. A material, as long as it is known in the art, may be employed without a limit for the auxiliary electrode. For example, the auxiliary electrode may include Li, Ca, LiF/Ca, LiF/Al, Al, Mg, BaF, Ba, Ag, a compound thereof, or a mixture thereof (e.g., a mixture of Ag and Mg). However, the embodiment of the present disclosure is not limited thereto. For example, the auxiliary electrode may also include indium tin oxide (ITO), zinc oxide (ZnO), or indium tin zinc oxide (ITZO). For example, the auxiliary electrode may be connected to the second electrode EL2 to function to decrease the resistance value of the second electrode EL2.

When the second electrode EL2 is a transmissive or reflective electrode, the second electrode EL2 may include Ag, Mg, Al, Pt, Pd, Au, Ni, Nd, Ir, Cr, Li, Ca, LiF/Ca, LiF/Al, Mo, Ti, or a compound thereof or a mixture thereof (for example, a mixture of Ag and Mg). Alternatively, the second electrode EL2 may have a multi-layered structure including a reflective film or semi-transmissive film formed of the above-mentioned materials and a transparent conductive film formed of indium tin oxide (ITO), indium zinc oxide (IZO), zinc oxide (ZnO), indium tin zinc oxide (ITZO), or the like.

The first electrode EL1 may be a reflective electrode, the second electrode EL2 may be a semi-transmissive or transmissive electrode. The organic electroluminescence display device 10 according to an embodiment of the present disclosure may include a top-emission type organic electroluminescence element OEL. However, the embodiment of the present disclosure is not limited thereto, and the organic electroluminescence element OEL may be a bottom-emission type.

The organic layer OL is disposed between the first and second electrodes EL1 and EL2. However, the embodiment of the present disclosure is not limited thereto, and the organic layer OL may include a hole transport region HTR, a light emitting layer EML, and an electron transport region ETR.

The hole transport region HTR is disposed on the first electrode EL1. The hole transport region HTR may have a single layer structure formed of a plurality of materials different from each other, or a structure in which a hole injection layer/a hole transport layer, a hole injection layer/a hole transport layer/a hole buffer layer, a hole injection layer/a hole buffer layer/a hole transport layer/a hole buffer layer, or a hole injection layer/a hole transport layer/an electron blocking layer are sequentially stacked from the first electrode EL1. However, the embodiment of the present disclosure is not limited thereto.

When the hole transport region HTR includes the hole transport layer, the hole transport region HTR may include a carbazole-based derivative such as N-phenyl carbazole, polyvinyl carbazole, a fluorine-based derivative, a triphenylamine-based derivative such as N,N'-bis(3-methylphenyl)-N,N'-diphenyl-[1,1-biphenyl]-4,4'-diamine (TPD), 4,4',4"-tris(N-carbazolyl)triphenylamine (TCTA), N,N-di(1-naphthyl)-N,N-diphenylbenzidine (NPB), 4,4'-Cyclohexylidene bis[N,N-bis(4-methylphenyObenzenamine] (TAPC), or the like, but the embodiment of the present disclosure is not limited thereto.

The thickness of hole transport region HTR may be from about 100 Å to about 10000 Å, for example, from about 100 Å to about 1500 Å. When the hole transport region HTR includes both the hole injection layer and the hole transport layer, the thickness of the hole injection layer may be about 100 Å to about 10000 Å, for example, about 100 Å to about 10000 Å, and the thickness of the hole transport layer may be about 50 Å to about 2000 Å, for example, about 100 Å to about 10000 Å. When the thicknesses of the hole transport region HTR, the hole injection layer, and the hole transport layer satisfy the above-mentioned range, a satisfactory degree of hole transporting characteristic may be obtained without a substantial increase in a driving voltage.

The hole transport region HTR may be formed through a general method well know in the art. For example, the hole transport region HTR may be formed through various methods, such as a vacuum deposition method, a spin coating method, a casting method, a Langmuir-Blodgettt (LB) method, an inkjet printing method, a laser printing method, and a laser induced thermal imaging (LITI) method.

The light emitting layer EML is disposed on the hole transport region HTR. The light emitting layer EML may have a single layer formed of a single material, a single layer formed of a plurality of materials different from each other, or a multilayer having a plurality of layers formed of a plurality of materials different from each other.

When the light emitting layer EML is a single layer, the light emitting layer EML may emit, for example, red light, green light, or blue light. However, the embodiment of the present disclosure is not limited thereto.

The light emitting layer EML may be formed through various methods, such as a vacuum deposition method, a spin coating method, a casting method, a Langmuir-Blodgettt (LB) method, an inkjet printing method, a laser printing method, and a laser induced thermal imaging (LITI) method.

The light emitting layer EML may be formed of a material which is not particularly limited if commonly used, but may be formed of, for example, a material emitting red, green, or blue colors, and includes a fluorescent material or a phosphorescent material. Also, the light emitting layer EML may include a host and a dopant.

As the host, a material is not particularly limited if only commonly used, but, for example, tris(8-hydroxyquinolino) aluminum (Alq$_3$), 4,4'-bis(N-carbazolyl)-1,1'-biphenyl (CBP), poly(n-vinylcabazole) (PVK), 9,10-di(naphthalene-2-yl)anthracene (ADN), 4,4',4"-Tris(carbazol-9-yl)-triphenylamine (TCTA), 1,3,5-tris(N-phenylbenzimidazole-2-yl) benzene (TPBi), 3-tert-butyl-9,10-di(naphth-2-yl) anthracene (TBADN), distyrylarylene (DSA), 4,4'-bis(9-carbazolyl)-2,2'-dimethyl-biphenyl (CDBP), 2-Methyl-9,10-bis(naphthalen-2-yl)anthracene (MADN), or the like may be used.

When the light emitting layer EML emits red light, the light emitting layer EML may include, for example, a fluorescent material, such as tris(dibenzoylmethanato) phenanthoroline europium (PBD:Eu(DBM)3(Phen)) or perylene. When the light emitting layer EML emits red light, the dopant included in the light emitting layer EML may be selected from metal complex such as bis(1-phenylisoquinoline)acetylacetonate iridium (PIQIr(acac)), bis(1-phenylquinoline)acetylacetonate iridium (PQIr(acac)), tris(1-phenylquinoline)iridium (PQIr) or octaethylporphyrin platinum (PtOEP), or organometallic complex.

When the light emitting layer EML emits green light, the light emitting layer EML may include, for example, a fluorescent material including tris(8-hydroxyquinolino)aluminum (Alq3). When the light emitting layer EML emits green light, the dopant included in the light emitting layer EML may be selected from metal complex such as fac-tris (2-phenylpyridine)iridium (Ir(ppy)3) or organometallic complex. When the light emitting layer EML emits blue light, the light emitting layer EML may include, for example, a fluorescent material including any one selected from a group consisting of spiro-DPVBi, spiro-6P, distyryl-benzene (DSB), distyryl-arylene (DSA), or Polyfluorene (PFO) based polymers and poly(p-phenylene vinylene (PPV) based polymers. When the light emitting layer EML emits blue light, the dopant included in the light emitting layer EML may be selected from metal complex such as (4,6-F2ppy)$_2$Irpic or organometallic complex.

The electron transport region ETR is disposed on the light emitting layer EML. The electron transport region ETR may include at least one of the hole blocking layer, the electron transport layer, and the electron injection layer, but the embodiment of the present disclosure is not limited thereto.

When the electron transport region ETR includes an electron transport layer, the electron transport region ETR may include Tris(8-hydroxyquinolinato)aluminum (Alq3), 1,3,5-Tri(1-phenyl-1H-benzo[d]imidazol-2-yl)phenyl (TPBi), 2,9-Dimethyl-4,7-diphenyl-1,10-phenanthroline (BCP), 4,7-Diphenyl-1,10-phenanthroline (Bphen), 3-(4-Biphenylyl)-4-phenyl-5-tert-butylphenyl-1,2,4-triazole (TAZ), 4-(Naphthalen-1-yl)-3,5-diphenyl-4H-1,2,4-triazole (NTAZ), 2-(4-Biphenylyl)-5-(4-tert-butylphenyl)-1,3,4-oxadiazole (t-Bu-PBD), Bis(2-methyl-8-quinolinolato-N1, O8)-(1,1'-Biphenyl-4-olato)aluminum (BAlq), berylliumbis (benzoquinolin-10-olate (Bebq$_2$), 9,10-di(naphthalene-2-yl) anthracene (ADN) and a mixture thereof, but the embodiment of the present disclosure is not limited thereto. The thickness of electron transport layer may be from about 100 Å to about 1000 Å, for example, from about 150 Å to about 500 Å. When the thickness of the electron transport layer satisfies the above-mentioned range, a satisfactory degree of electron transport characteristic may be obtained without a substantial increase in the driving voltage.

When the electron transport region ETR includes an electron injection layer, lanthanum group metal such as LiF, lithium quinolate (LiQ), Li2O, BaO, NaCl, CsF, and Yb, or metal halide such as RbCl and RbI may be used for the electron transport region, but the embodiment of the present disclosure is not limited thereto. The electron injection layer may also be formed of a material which is a mixture of an electron transport material and an organo metal salt. The organo metal salt may be a material having an energy band gap of about 4 eV or more. Specifically, for example, the organo metal salt may include metal acetate, metal benzodate, metal acetoacetate, metal acetylacetonate or metal stearate. The thickness of electron injection layer may be from about 1 Å to about 100 Å, for example, from about 3 Å to about 90 Å. When the thickness of electron injection layer satisfies the above-mentioned range, a satisfactory degree of electron injection characteristic may be obtained without a substantial increase in the driving voltage.

The electron transport region, as described above, may include the hole blocking layer. The hole blocking layer, for example, may include at least one of 2,9-dimethyl-4,7-diphenyl-1,10-phenanthroline (BCP) or 4,7-diphenyl-1,10-phenanthroline (Bphen), but the embodiment of the present disclosure is not limited thereto.

The electron transport region ETR may be formed through various methods, such as a vacuum deposition method, a spin coating method, a casting method, a Langmuir-Blodgettt (LB) method, an inkjet printing method, a laser printing method, and a laser induced thermal imaging (LITI) method.

Figure 7:
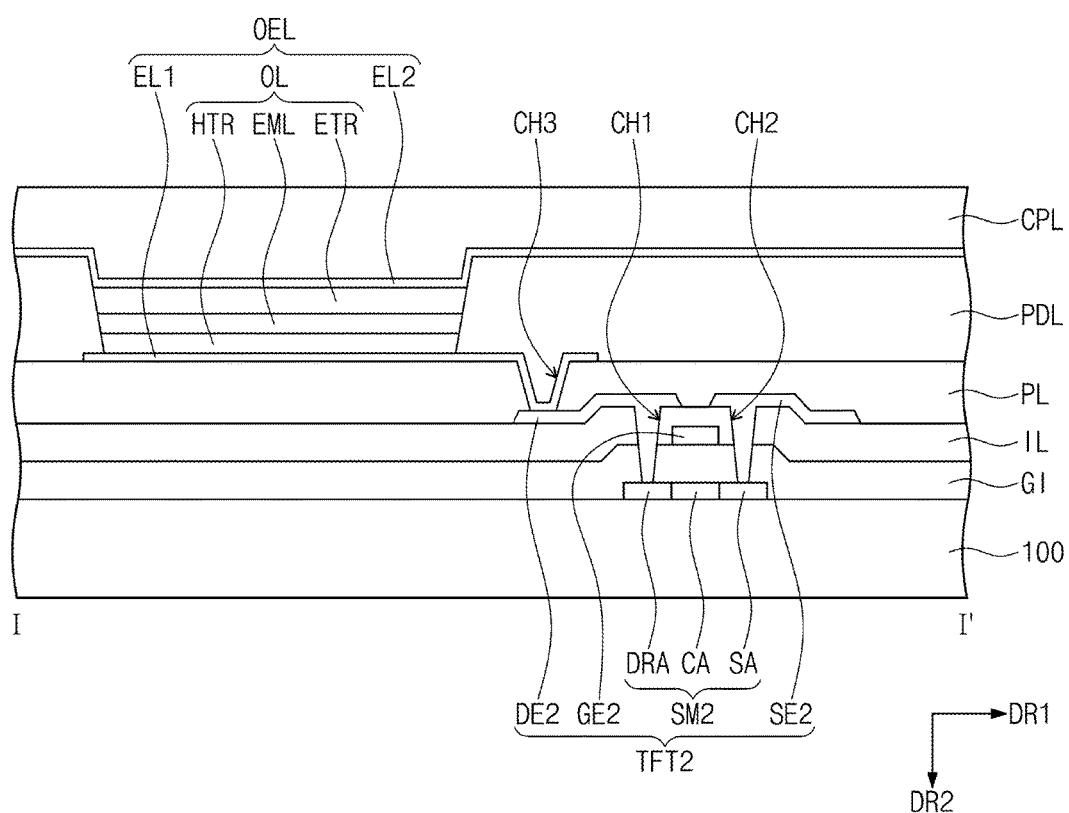
FIG. 7 is a schematic cross-sectional view of a portion of the circuit diagram according to FIG. 5.
Figure 8:
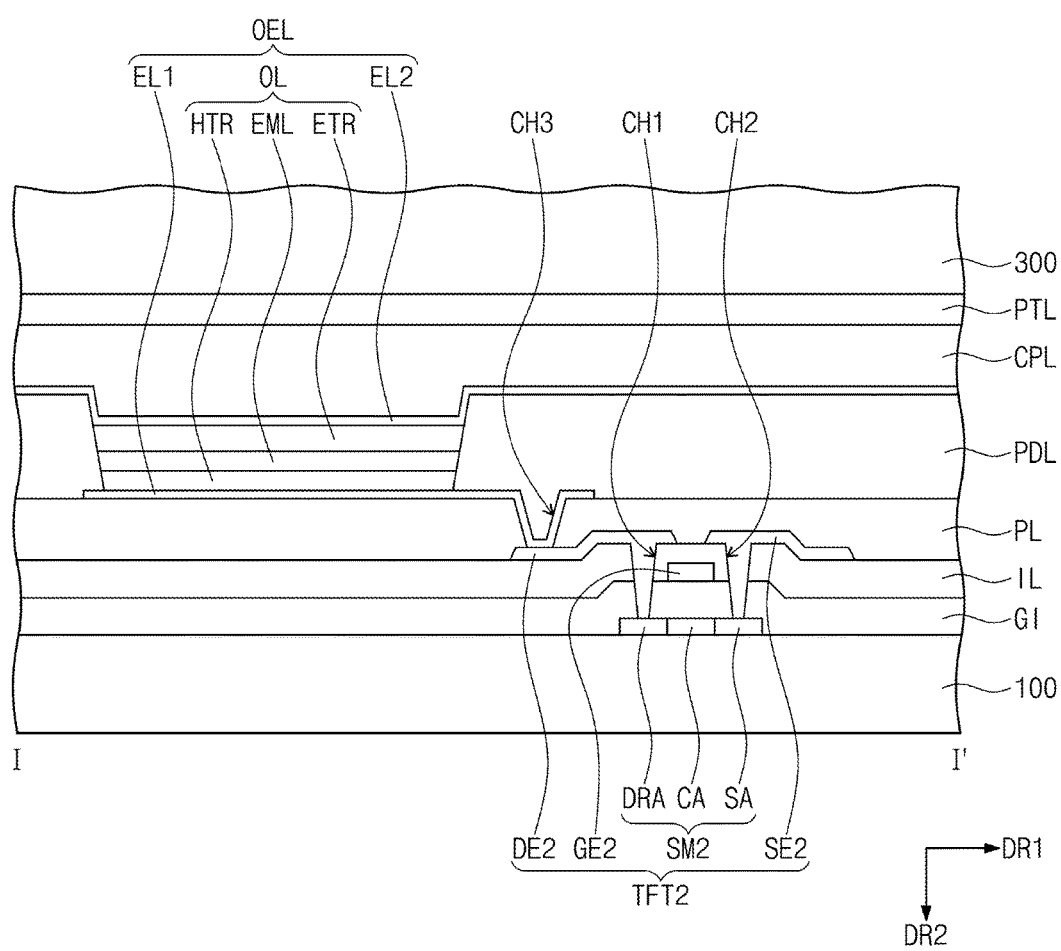
FIG. 8 is a schematic cross-sectional view of a portion of the circuit diagram according to FIG. 5.

FIG. 7 is a schematic cross-sectional view of a portion of the circuit diagram according to FIG. 5. FIG. 8 is a cross-sectional view of an embodiment different from that in FIG. 7.

Referring to FIG. 7, the organic electroluminescent element OEL may further include a capping layer CPL disposed on the second electrode EL2. The capping layer CPL may include, for example, α-NPD, NPB, TPD, m-MTDATA, Alq3, CuPc, N4,N4,N4',N4'-tetra (biphenyl-4-yl) biphenyl-4,4'-diamine (TPD15), 4,4',4"-Tris (carbazol sol-9-yl) triphenylamine), N,N'-bis (naphthalen-1-yl (TCTA), or the like.

The capping layer CPL functions to assist light emitted from the light emitting layer EML to be efficiently emitted to the outside of the organic electroluminescent element OEL.

The capping layer CPL may have a refractive index of about 1.6 to about 2.4. When the refractive index of the capping layer CPL is less than 1.6, light emitted from the light emitting layer EML is not sufficiently reflected from the upper surface of the capping layer CPL toward the light emitting layer EML, and thus an amount of light amplifiable by the resonant effect inside the organic layer OL may be decreased. Accordingly, the effect of improving light efficiency of the organic electroluminescent element OEL due to the capping layer CPL may be insufficient. When the refractive index of the capping layer CPL is greater than 2.4, light emitted from the light emitting layer EML is excessively reflected from the upper surface of the capping layer CPL toward the light emitting layer EML, and thus an amount of light which may pass through the capping layer CPL to display an image may be decreased.

The capping layer CPL may be thinner than the first inorganic layer (310a of FIG. 2). That is, the thickness D1 of the first inorganic layer (310a of FIG. 2) may be greater than the thickness of the capping layer CPL.

As described above, the light efficiency of the organic electroluminescent element OEL may be improved by disposing the capping layer CPL on the second electrode EL2. However, reflectivities of a short wavelength and a long wavelength vary in a reverse direction to each other according to the thickness of the capping layer CPL, and accordingly, there is a problem in that the light extracting efficiency of blue light having a relatively short wave length and green and red light which have relatively long wavelengths has a trade-off relationship. That is, when the light extracting efficiency of blue light is increased according to the thickness of the capping layer CPL, the light extracting efficiency of green and red light is decreased, and conversely, when the light extracting efficiency of green and red light is increased according to the thickness of the capping layer CPL, the light extracting efficiency of blue light is decreased. Consequently, there is a problem in that the effect of improving the light extracting efficiency is not great in an aspect of white light efficiency.

Referring again to FIG. 2, the organic electroluminescence display device 10 according to an embodiment of the present disclosure allows the light extracting efficiency of red, green and blue light to be simultaneously increased by allowing the first and second layers 311 and 312, which have refractive indexes different from each other, to be alternately disposed in the first inorganic layer 310a which is disposed most adjacent to the organic electroluminescent element OEL in the encapsulating member 300. In the encapsulating member 300, inorganic layers such as the second inorganic layer 310b except for the first inorganic layer 310a are disposed on the relatively thick first organic layer 320a, and thus have difficulty in optically affecting the display member 200 substantially. Accordingly, in the organic electroluminescence display device 10 according to an embodiment of the present disclosure, only the first inorganic layer 310a in the encapsulating member 300 is disposed in a multilayer structure to have an optical influence, and other layers are disposed in a single layer.

FIG. 8 is a schematic cross-sectional view of a portion of the circuit diagram according to FIG. 5. FIG. 8 is a cross-sectional view of an embodiment different from that in FIGS. 6 and 7.

An encapsulating member 300 may be directly on the display member (200 of FIG. 1). However, the embodiment of the present disclosure is not limited thereto. Referring to FIG. 8, a protective layer PTL may be disposed between a capping layer CPL and the encapsulating member 300. The protective layer PTL may be disposed on the capping layer CPL or a second electrode EL2. The protective layer PTL functions to prevent damage, to the capping layer CPL or an organic layer OL, which may occur when the encapsulating member 300 is disposed directly thereon. However, the embodiment of the present disclosure is not limited thereto, and the protective layer PTL may include lithium fluoride, silicon oxide, or silicon nitride. For example, the protective layer PTL may be a lithium fluoride layer. The protective layer PTL may be formed thinner than the capping layer CPL, for example, may have a thickness of about 20 nm to about 40 nm inclusive.

Hereinafter, referring again to FIGS. 1 to 3, an organic electroluminescence display device according to a still another embodiment of the present disclosure will be described. Hereinafter, the difference with the above-mentioned organic electroluminescence display device according to an embodiment of the present disclosure will be mainly described, and the portions which will not be mentioned is the same as that in the above-mentioned organic electroluminescence display device according to an embodiment of the present disclosure.

An organic electroluminescence display device 10 according to an embodiment of the present disclosure includes a base member 100, a display member 200 disposed on the base member 100 and including an organic electroluminescent element, and an encapsulating member 300 disposed on the display member 200 and encapsulates the display member 200.

The encapsulating member 300 has a multilayer structure in which one or more organic layers 320a and 320b and one or more inorganic layers 310a, 310b, and 310c are alternately disposed.

The inorganic layer 310a disposed most adjacent to the display member 200 from among the one or more inorganic layers 310a, 310b, and 310c has a multilayer structure in which a first layer 311 having a first refractive index and a second layer 312 having a second refractive index are alternately disposed. The first and second refractive indexes are different from each other. That is, the inorganic layer 310a disposed most adjacent to the display member 200 has a multilayer structure in which a high-refractive index layer and a low-refractive index layer are alternately disposed.

From among the one or more inorganic layers 310a, 310b, and 310c, the inorganic layer 310a disposed most adjacent to the display member 200 has a multilayer structure and one or more organic layers 320a and 320b respectively have single layers. That is, from among the plurality of layers included in the encapsulating member 300, only the inorganic layer 310a disposed most adjacent to the display member 200 has a multilayer structure and other layers have single layers.

The inorganic layer 310a disposed most adjacent to the display member 200 includes a first sub inorganic layer 310-1, a second sub inorganic layer 310-2 disposed on the first sub inorganic layer 310-1, and a third sub inorganic layer 310-3 disposed on the second sub inorganic layer 310-2. One surface of the second sub inorganic layer 310-2 may be brought into contact with the first sub inorganic layer 310-1, and the other surface may be brought into contact with the third sub inorganic layer 310-3.

Each of the first sub inorganic layer 310-1, the second sub inorganic layer 310-2, and the third sub inorganic layer 310-3 may include one first layer 311 and one second layer 312. The first and second layers 311 and 312 may be brought into contact with each other. That is, another layer such as a buffer layer is not disposed between the first and second layers 311 and 312.

The above-mentioned description on the thickness relationship, materials, and the like of the first sub inorganic layer 310-1, the second sub inorganic layer 310-2, and the third sub inorganic layer 310-3 may be applied, as it is, and thus will not be provided.

The organic electroluminescence display device 10 according to an embodiment of the present disclosure may improve the light extraction efficiency of each of red, green, and blue light which are generated from the organic electroluminescent element OEL, and may consequently improve white light extraction efficiency. The organic electroluminescence display device 10 according to an embodiment of the present disclosure may realize a high efficiency and a long service life.

Hereinafter, the present disclosure will be described in more detail through specific an example and a comparative example. The example below is merely exemplified to help understand the present disclosure, but the scope of the present disclosure is not limited thereto.

Example 1

An organic electroluminescent element including a protective layer which is disposed on a capping layer having a thickness of about 85 nm and has a thickness of about 30 nm was manufactured. A first inorganic layer was formed by alternately laminating a first layer formed of SiON and a second layer formed of $SiO_2$ on the organic electroluminescent element. Specifically, the first inorganic layer was formed to have a structure (3-pair structure) in which the first layer (about 200 nm)/a second layer (about 100 nm)/a first layer (about 130 nm)/a second layer (about 100 nm)/a first layer (about 230 nm)/a second layer (about 100 nm) were sequentially disposed on the protective layer. A first organic layer having a thickness of about 4 μm was formed on the first inorganic layer, and a second inorganic layer having a thickness of about 700 nm was formed on the first organic layer. The second inorganic layer was a silicon nitride layer. Each of the first and second inorganic layers was formed through a chemical vapor deposition (CVD) method, and the first organic layer was formed through an inkjet printing method.

Comparative Example 1

Except that a first inorganic layer had a single layer structure formed of SiON, manufacturing was preformed the same as in Example 1. The first inorganic layer of Comparative example 1 was formed to have a thickness of about 1000 nm.

Figure 9:
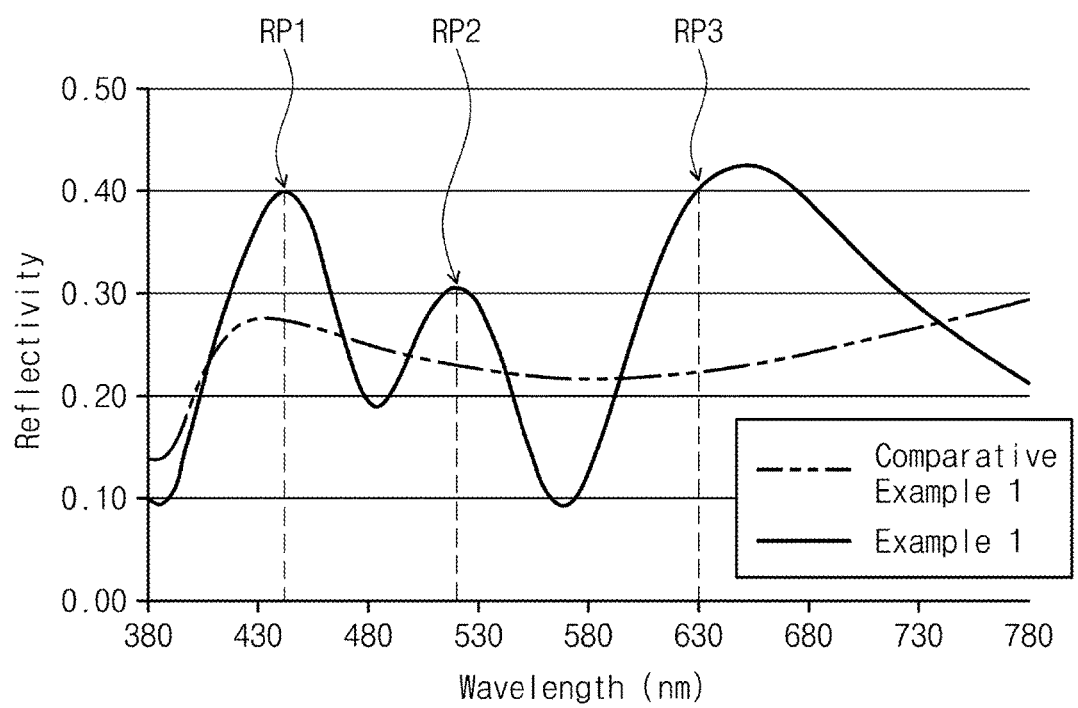
FIG. 9 is a reflectivity measurement graph in a visible light range of an organic electroluminescence display device according to an Example 1 and a Comparative example 1.

FIG. 9 is a reflectivity measurement graph in a visible light range for an organic electroluminescence display device according to Example 1 and Comparative example 1. More specifically, FIG. 9 is a graph measuring reflectivity in a visible light range for an encapsulating member included in an organic electroluminescence display device according to Example 1 and Comparative example 1.

Referring to FIG. 9, it may be understood that the organic electroluminescence display device according to Example 1 has three reflectivity peaks which have maximum reflectivity of about 30% or more (0.30 or more in y-axis) in a wavelength region of 380 nm to 780 nm inclusive, whereas the organic electroluminescence display device according to Comparative example 1 does not have a reflectivity peak.

Specifically, the organic electroluminescence display device according to Example 1 has a first reflectivity peak in a blue light range, has a second reflectivity peak in a green light range, and has a third reflectivity peak in a red light range. Therefore, it may be understood that the organic electroluminescence display device according to Example 1 has a superior light balance of blue, green, and red light, and a superior white light efficiency. On the contrary, it may be understood that an effect of improving light efficiency is difficult to be expected from the encapsulating member included in the organic electroluminescence display device according to Comparative example 1.

Figure 10A:
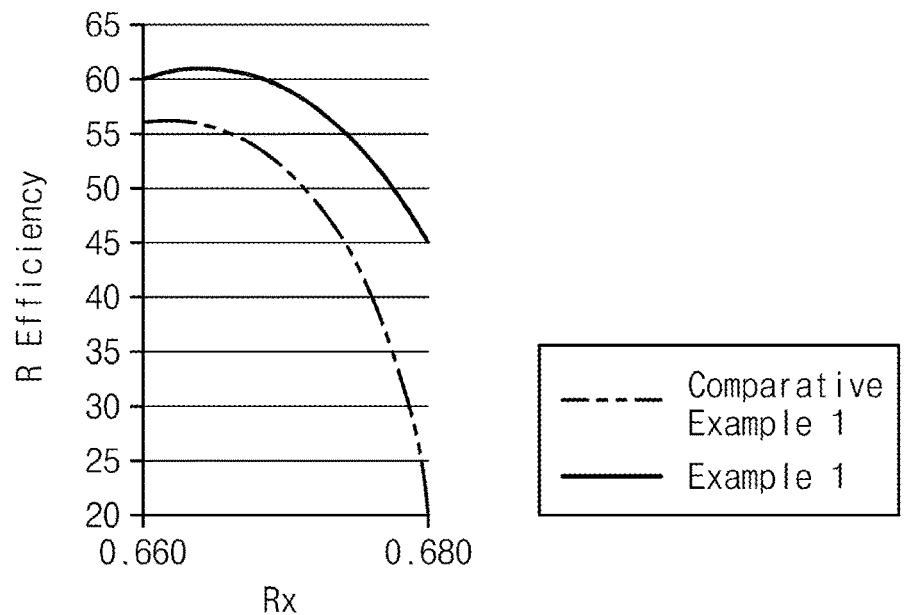
FIGS. 10A, 10B, and 10C are reflection measurement graphs for each emitted color of an organic electroluminescence display device according to Example 1 and Comparative example 1.
Figure 10B:
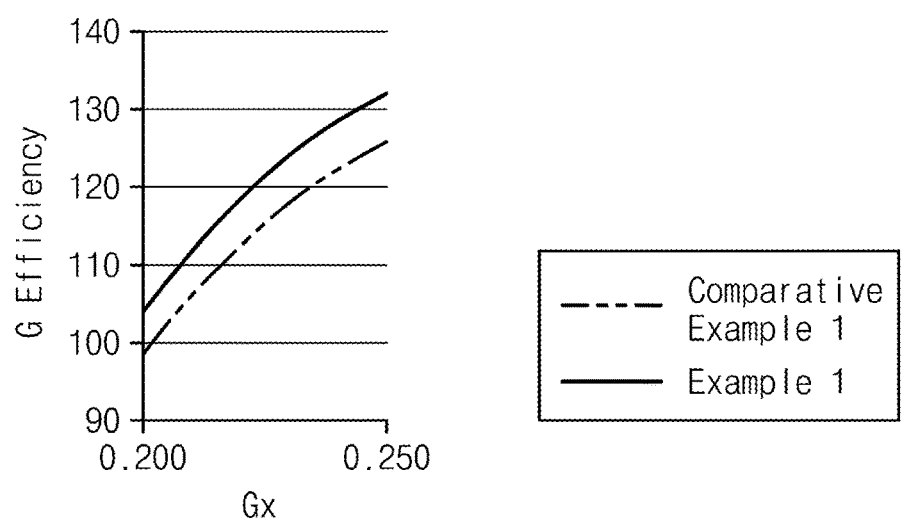
Figure 10C:
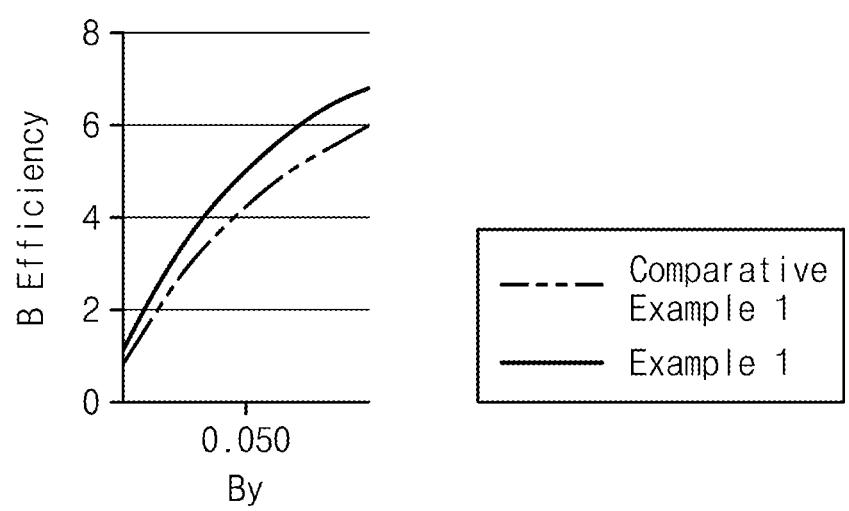

FIGS. 10A to 10C are reflectivity measurement graphs for each emitted color of an organic electroluminescence display device according to Example 1 and Comparative example 1. Referring to FIGS. 10A to 10C, the effect of improving light extraction of the organic electroluminescence display device according to an embodiment of the present disclosure may be understood more specifically.

In the graphs of FIG. 10A to 10C, the x-axes respectively represent color coordinates of red, green, and blue colors, and the y-axis respectively represent color efficiencies of red, green, and blue colors.

FIG. 10A is a graph of comparing red light efficiency of Example 1 with Comparative example 1. As illustrated in FIG. 10A, the organic electroluminescence display device according to Example 1 has a superior red light efficiency to that according to Comparative example 1. Specifically, the effect of improving red light efficiency is about 11%.

FIG. 10B is a graph of comparing green light efficiency of Example 1 with Comparative example 1. As illustrated in FIG. 10B, the organic electroluminescence display device according to Example 1 also has a superior green light efficiency to that according to Comparative example 1. Specifically, the effect of improving green light efficiency is about 6%.

FIG. 10C is a graph of comparing blue light efficiency of Example 1 with Comparative example 1. As illustrated in FIG. 10C, the organic electroluminescence display device according to Example 1 also has a superior blue light efficiency to that according to Comparative example 1. Specifically, the effect of improving blue light efficiency is about 14%.

Through the above results, the light efficiency of the organic electroluminescence display device according to Example 1 is superior to that according to Comparative example 1. More specifically, the light efficiency of red, green, and blue light may be simultaneously improved, and exhibits an effect of improving white light efficiency by about 12%.

According to an embodiment of the present disclosure, an organic electroluminescence display device may have improved light efficiency.

According to an embodiment of the present disclosure, an organic electroluminescence display device may have a long service life.

The above-disclosed subject matter is to be considered illustrative and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description. Therefore, the above-described embodiments are illustrative in all the aspects, and should be construed as not being limitative.

What is claimed is:

1. An organic electroluminescence display device comprising:
    a base member;
    a display member disposed on the base member and including an organic electroluminescent element; and
    an encapsulating member disposed on the display member and encapsulating the display member, wherein the encapsulating member includes:
a first inorganic layer disposed on the display member;
a first organic layer disposed on the first inorganic layer; and
a second inorganic layer disposed on the first organic layer, wherein:
the first inorganic layer has a multilayer structure in which first layers having a first refractive index and second layers having a second refractive index different from the first refractive index are alternately disposed, and
each of the first organic layer and the second inorganic layer has a single layer structure, wherein the first inorganic layer comprises:
a first sub inorganic layer disposed on the display member;
a second sub inorganic layer disposed on the first sub inorganic layer; and
a third sub inorganic layer disposed on the second sub inorganic layer,
wherein each of the first sub inorganic layer, the second sub inorganic layer, and the third sub inorganic layer includes one of the first layers and one of the second layers.

2. The organic electroluminescence display device of claim 1, wherein the encapsulating member further comprises:
a second organic layer disposed on the second inorganic layer; and
a third inorganic layer disposed on the second organic layer,
wherein each of the second organic layer and the third inorganic layer has a single layer structure.

3. The organic electroluminescence display device of claim 1, wherein the first and second layers contact each other.

4. The organic electroluminescence display device of claim 1, wherein a thickness of the first sub inorganic layer is greater than a thickness of the second sub inorganic layer and smaller than a thickness of the third sub inorganic layer.

5. The organic electroluminescence display device of claim 1, wherein
a thickness of the first sub inorganic layer is about 270 nm to about 300 nm inclusive,
a thickness of the second sub inorganic layer is about 210 nm to about 250 nm inclusive, and
a thickness of the third sub inorganic layer is greater than about 300 nm and equal to or smaller than 360 nm.

6. The organic electroluminescence display device of claim 1, wherein the first inorganic layer has three reflectivity peaks in a wavelength range of about 380 nm to about 780 nm inclusive.

7. The organic electroluminescence display device of claim 6, wherein the three reflectivity peaks include:
a first reflectivity peak in a wavelength range of about 380 nm to about 450 nm inclusive;
a second reflectivity peak in a wavelength range of about 480 nm to about 580 nm inclusive; and
a third reflectivity peak in a wavelength range of about 590 nm to about 700 nm inclusive.

8. The organic electroluminescence display device of claim 1, wherein the first refractive index is about 1.65 to about 1.80 inclusive, and the second refractive index is about 1.40 to about 1.50 inclusive.

9. The organic electroluminescence display device of claim 1, wherein the first refractive index is greater than the second refractive index, the first layers comprise at least one of silicon nitride or silicon oxynitride, and the second layers comprise silicon oxide.

10. The organic electroluminescence display device of claim 1, wherein a thickness of the first organic layer is about three times to about eight times greater than a thickness of the first inorganic layer.

11. The organic electroluminescence display device of claim 1, wherein the organic electroluminescent element comprises:
a first electrode disposed on the base member;
an organic layer including a light emitting layer disposed on the first electrode;
a second electrode disposed on the organic layer; and
a capping layer disposed on the second electrode.

12. The organic electroluminescence display device of claim 11, further comprising a protective layer disposed between the capping layer and the encapsulating member.

13. The organic electroluminescence display device of claim 11, wherein a thickness of the first inorganic layer is greater than a thickness of the capping layer.

14. An organic electroluminescence display device comprising:
a base member;
a display member disposed on the base member and including an organic electroluminescent element; and
an encapsulating member disposed on the display member and encapsulating the display member,
wherein the encapsulating member includes at least one organic layer and at least one inorganic layer which are alternately disposed therein, wherein
an inorganic layer from among the at least one inorganic layer disposed most adjacent to the display member has a multilayer structure in which first layers having a first refractive index and second layers having a second refractive index different from the first refractive index are alternately disposed, and
each of the remaining inorganic layers among the at least one inorganic layer except for the inorganic layer disposed most adjacent to the display member and the at least one organic layer has a single layer structure, wherein the inorganic layer disposed most adjacent to the display member comprises:
a first sub inorganic layer disposed on the display member;
a second sub inorganic layer disposed on the first sub inorganic layer; and
a third sub inorganic layer disposed on the second sub inorganic layer,
wherein each of the first sub inorganic layer, the second sub inorganic layer, and the third sub inorganic layer includes one of the first layers and one of the second layers.

15. The organic electroluminescence display device of claim 14, wherein the first refractive index is about 1.65 to about 1.80 inclusive, and the second refractive index is about 1.40 to about 1.50 inclusive.

16. The organic electroluminescence display device of claim 14, wherein the first refractive index is greater than the second refractive index, the first layers comprise at least one of silicon nitride or silicon oxynitride, and the second layers comprise silicon oxide.

17. The organic electroluminescence display device of claim 14, wherein a thickness of the first sub inorganic layer is greater than a thickness of the second sub inorganic layer and is smaller than a thickness of the third sub inorganic layer.

18. The organic electroluminescence display device of claim 14, wherein
   a thickness of the first sub inorganic layer is about 270 nm to about 300 nm inclusive,
   a thickness of the second sub inorganic layer is about 210 nm to about 250 nm inclusive, and
   a thickness of the third sub inorganic layer is greater than about 300 nm and equal to or smaller than 360 nm.

* * * * *